(12) United States Patent
Ono

(10) Patent No.: US 7,517,410 B2
(45) Date of Patent: Apr. 14, 2009

(54) MICRO ADHESIVE NOZZLE AND ADHESIVE APPLYING APPARATUS

(75) Inventor: Masaharu Ono, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 592 days.

(21) Appl. No.: 11/136,374

(22) Filed: May 25, 2005

(65) Prior Publication Data

US 2005/0263250 A1    Dec. 1, 2005

(30) Foreign Application Priority Data

May 25, 2004  (JP)  ............................. 2004-154468
Feb. 4, 2005  (JP)  ............................. 2005-028453

(51) Int. Cl.
*B05C 3/02*    (2006.01)
(52) U.S. Cl. ...................... 118/410; 118/669
(58) Field of Classification Search ................. 118/410, 118/323, 679, 668, 669, 671
See application file for complete search history.

(56) References Cited

U.S. PATENT DOCUMENTS

| 4,291,642 A | * | 9/1981 | Kolc | ........................ 118/415 |
| 4,941,428 A | * | 7/1990 | Engel | ........................ 118/680 |
| 5,860,575 A | | 1/1999 | Akin et al. | |
| 2005/0092782 A1 | | 5/2005 | Takahashi et al. | |

FOREIGN PATENT DOCUMENTS

| CN | 1110232 | 5/2003 |
| EP | 0 278 457 A2 | 8/1988 |
| JP | 62-45094 | 2/1987 |
| JP | 62-118478 | 7/1987 |
| JP | 2544122 | 5/1997 |
| JP | 3498440 | 12/2003 |

* cited by examiner

*Primary Examiner*—Brenda A Lamb
(74) *Attorney, Agent, or Firm*—Oblon, Spivak, McClelland, Maier & Neustadt, P.C.

(57) ABSTRACT

A micro adhesive nozzle for applying adhesive on a printed circuit board is disclosed. The nozzle includes a nozzle tip portion with a protruding portion arranged at a periphery of the nozzle tip portion, an adhesive discharge opening portion formed within the periphery of the nozzle tip portion, and a gap provided between the discharge opening portion and the protruding portion.

9 Claims, 12 Drawing Sheets

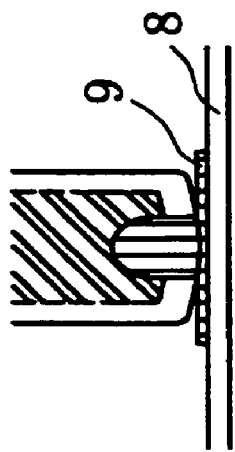 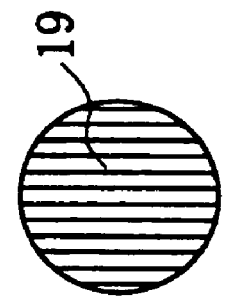
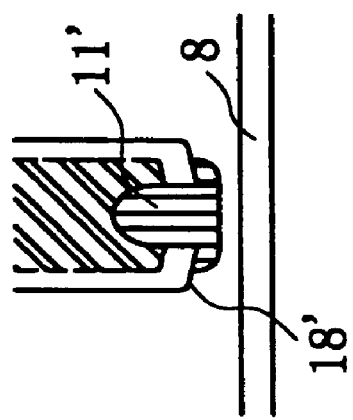 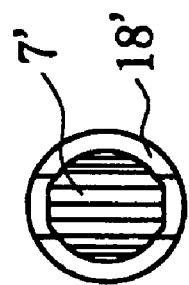
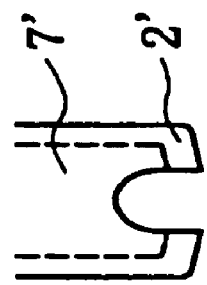 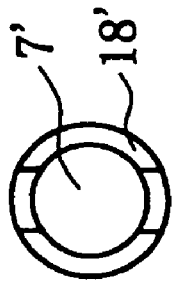

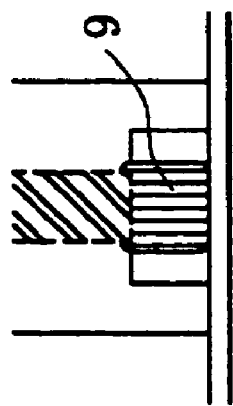
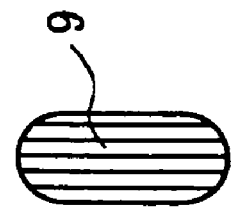
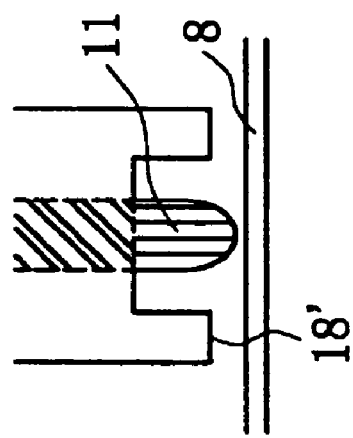
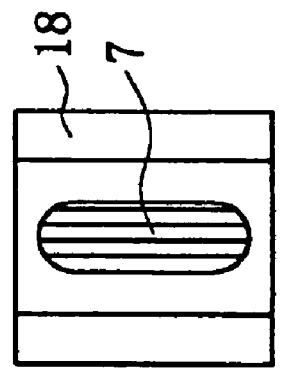
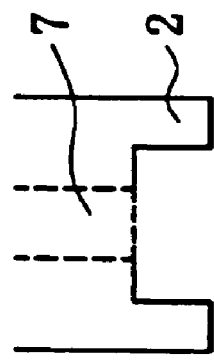
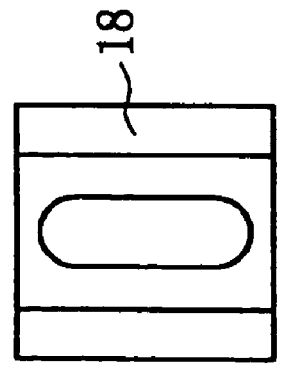

FIG.11B

| COMPONENT NAME | MOUNTING POSITION | MOUNTING DIRECTION | COMPONENT SHAPE | ... | ... |
|---|---|---|---|---|---|
| 0001 | X=a, Y=a' | A | ... | ... | ... |
| 0002 | X=b, Y=b' | B | ... | ... | ... |
| 0003 | X=c, Y=c' | A | ... | ... | ... |
| ... | ... | ... | ... | ... | ... |

MICRO ADHESIVE NOZZLE AND ADHESIVE APPLYING APPARATUS

BACKGROUND OF THE INVENTION

1. Field of the Invention

The present invention relates generally to a micro adhesive nozzle for applying adhesive on a printed circuit board and an adhesive applying apparatus implementing such a nozzle. The present invention particularly relates to an adhesive nozzle that is capable of realizing stable application of adhesive for attaching micro components such as chip components, and preventing the occurrence of variations in the amount of adhesive being applied, the adhesive applying nozzle further being arranged so that a nozzle tip does not come into contact with the adhesive even when the space between the mounted chip components is narrow.

2. Description of the Related Art

Conventionally, in soldering chip components and insert components on a printed circuit board, a mass soldering process is conducted in a flow soldering bath. In conducting the soldering process, the chip components are provisionally attached to the printed circuit board using adhesive in order to prevent the mounted chip components from being detached even when the chip components are positioned at a bottom side of the printed circuit board.

As an exemplary method of provisionally attaching a chip component, an adhesive applying apparatus may be used to apply a suitable amount of adhesive at one or two points in between pads provided on the printed circuit board. Then, a chip component mounting apparatus may be used to mount the chip component after adjusting the positioning of the pads on the printed circuit board and the chip component electrode. Then, a mass heating process may be conducted using a hardening furnace, for example, to harden the applied adhesive and realize provisional attachment of the chip component.

In realizing the provisional attachment of chip components as is described above, an adhesive applying nozzle may be used to apply the adhesive as a micro-pattern. It is noted that exemplary applications of such a technique are described in Japanese Utility Model No. 2544122 and Japanese Patent No. 3498440.

Japanese Utility Model No. 2544122 discloses a technique of providing a pair of adhesive applying nozzle units and a pair of stopper units at a tip portion of a nozzle main body. However, according to this technique, the amount of adhesive being applied may not be sufficiently and stably controlled. Also, the nozzle may not be adaptable to different pad configurations for different types of chip components, and the space between the stopper units has to be taken into account in setting the space between the pads so that high-density component placement may be restricted.

Japanese Patent No. 3498440 discloses a technique of integrally forming a nozzle unit and a stopper unit to realize high-density mounting of micro components. However, according to this technique, the diameter of the applied adhesive may broaden beyond the allowed range, or adhesive may not be applied between a pair of nozzles.

It is noted that in recent years and continuing, miniaturization and price reduction of chip components is progressing as well as higher densification of electronic components (high-density component placement). In turn, techniques are demanded for accurately and stably supplying a suitable amount of adhesive for provisionally attaching small size chip components (micro components) without inducing the applied adhesive to spread to an electrode portion. However, problems exist in the prior art for suitably attaching small size chip components in such a manner, particularly with respect to 1005 size (i.e., 1.0×0.5 mm) chip components and smaller chip components. Thereby, in the prior art, small size chip components (micro chip components) of a 1005 size format or smaller may not be used in a printed circuit board that is subject to a mass soldering in a flow solder bath. Due to such a constraint, the design flexibility with respect to the placement of electronic components on the printed circuit board is limited.

In this regard, the present inventor has previously proposed a technique for enabling stable application of adhesive with little variations in the amount of adhesive being applied and narrowing of the spacing between adjacent chip components upon applying adhesive as a micro-pattern for attaching micro chip components on a printed circuit board, the technique involving providing a trench structure at a tip portion of a nozzle unit of an adhesive applying nozzle that applies adhesive on a printed circuit board.

However, according to the above proposed technique, when the space between adjacent chip components is narrow, the applied adhesive may come into contact with an adjacent chip component, and the applied adhesive may also come into contact with the tip of the nozzle so that the nozzle may have to be cleaned afterwards.

SUMMARY OF THE INVENTION

Accordingly, it is an object of the present invention to provide a micro adhesive nozzle that is configured to apply adhesive for attaching micro components such as 1.0×0.5 mm size chip components, the micro adhesive nozzle being capable of reducing variations in the amount of adhesive being applied, realizing stable application of the adhesive, preventing the adhesive from coming into contact with the chip components even when the space between adjacent chip components is narrow, and preventing the adhesive from coming into contact with the nozzle tip portion. It is also an object of the present invention to provide an adhesive applying apparatus using such a micro adhesive nozzle.

According to an aspect of the present invention, a micro adhesive nozzle for applying adhesive on a printed circuit board is provided, the nozzle including a nozzle tip portion with a protruding portion arranged at a periphery of the nozzle tip portion, an adhesive discharge opening portion formed within the periphery of the nozzle tip portion, and a gap provided between the discharge opening portion and the protruding portion.

According to a preferred embodiment of the present invention, the nozzle tip portion is arranged to have an outer dimension that is less than or equal to 1.5×1.5 mm.

According to another preferred embodiment of the present invention, the adhesive discharge opening portion is arranged to have a dimension that is less than or equal to 0.9×0.3 mm.

According to another preferred embodiment of the present invention, the height of the protruding portion is arranged to be less than or equal to 0.15 mm.

According to another preferred embodiment of the present invention, a reinforcing process is conducted on the nozzle tip portion.

According to another aspect of the present invention, an adhesive applying apparatus is provided that implements the micro adhesive nozzle of the present invention.

According to other aspects of the present invention, a printed circuit board and an electronic apparatus are provided that are fabricated using the micro adhesive nozzle of the present invention.

BRIEF DESCRIPTION OF THE DRAWINGS

FIGS. 6A~6F are front views and plan views of the adhesive nozzle of the prior art conducting an adhesive applying process;

FIGS. 7A~7F are front views and plan views of the adhesive nozzle of the present embodiment conducting an adhesive applying process;

FIG. 11B is a table showing the storage contents of a component mounting information storage unit.

DESCRIPTION OF THE PREFERRED EMBODIMENTS

In the following, preferred embodiments of the present invention are described with reference to the accompanying drawings.

Figure 9:
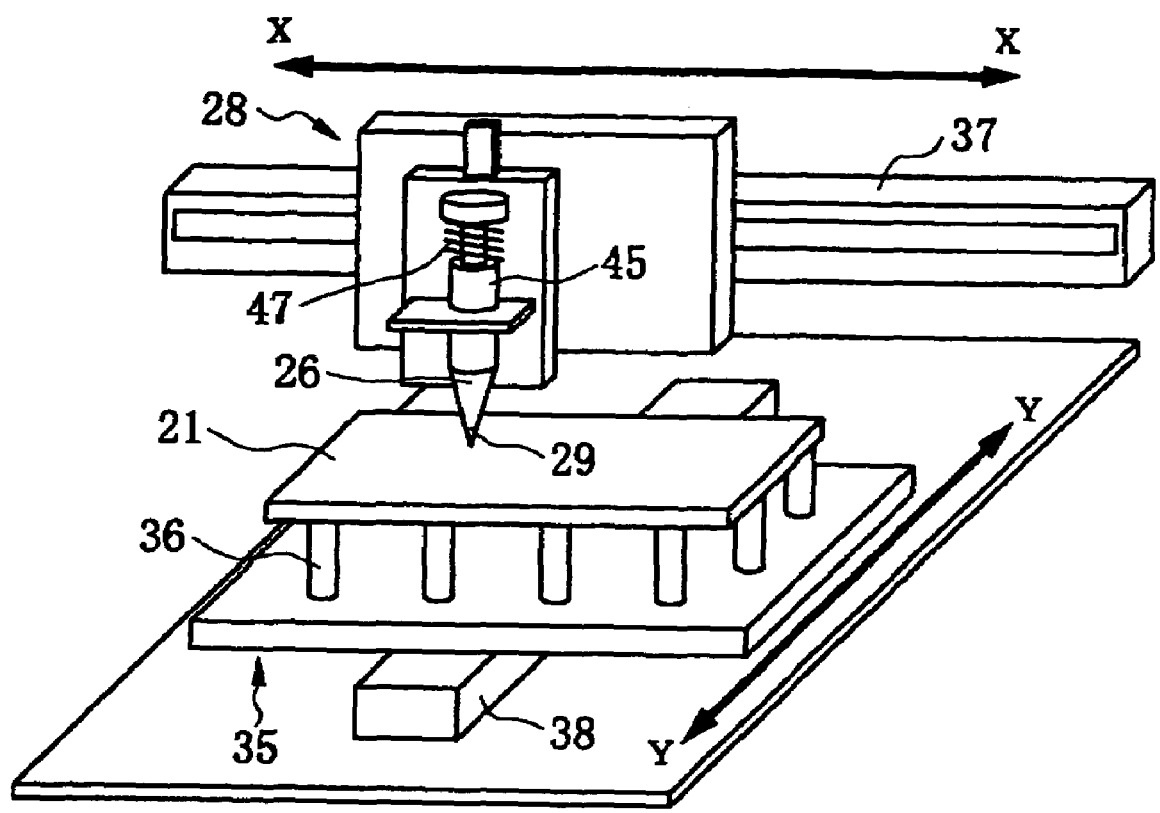
FIG. 9 is a diagram showing a configuration of an adhesive applying apparatus according to an embodiment of the present invention.

FIG. 9 is a diagram showing a configuration of an adhesive applying apparatus including a micro adhesive nozzle according to an embodiment of the present invention.

The adhesive applying apparatus of FIG. 9 includes a printed circuit board 21, a head unit 28, a table unit 35, and guide members 37 and 38. The head unit 28 may be guided by the guide member 37 to move in X directions (represented by the bidirectional arrow X-X in FIG. 9), and the table unit 35 may be guided by the guide member 38 to move in Y directions (represented by the bidirectional arrow Y-Y in FIG. 9). The head unit 28 includes an adhesive applying head 45 that is realized by an adhesive nozzle 26 having a nozzle tip portion 29, and a shock absorbing unit 47. The printed circuit board 21 is supported by the table unit 35 via support pins 36. By moving the head unit 28 in the X directions, and moving the table unit 35 in the Y directions, the adhesive nozzle 26 may be positioned at a desired position on the printed circuit board so that adhesive may be applied at the desired position.

It is noted that in modified configurations of the adhesive applying apparatus, the upper part may be arranged to move in the X directions while the lower part is fixed, or the upper part may be fixed while the lower part is arranged to move in the Y directions.

Figure 10:
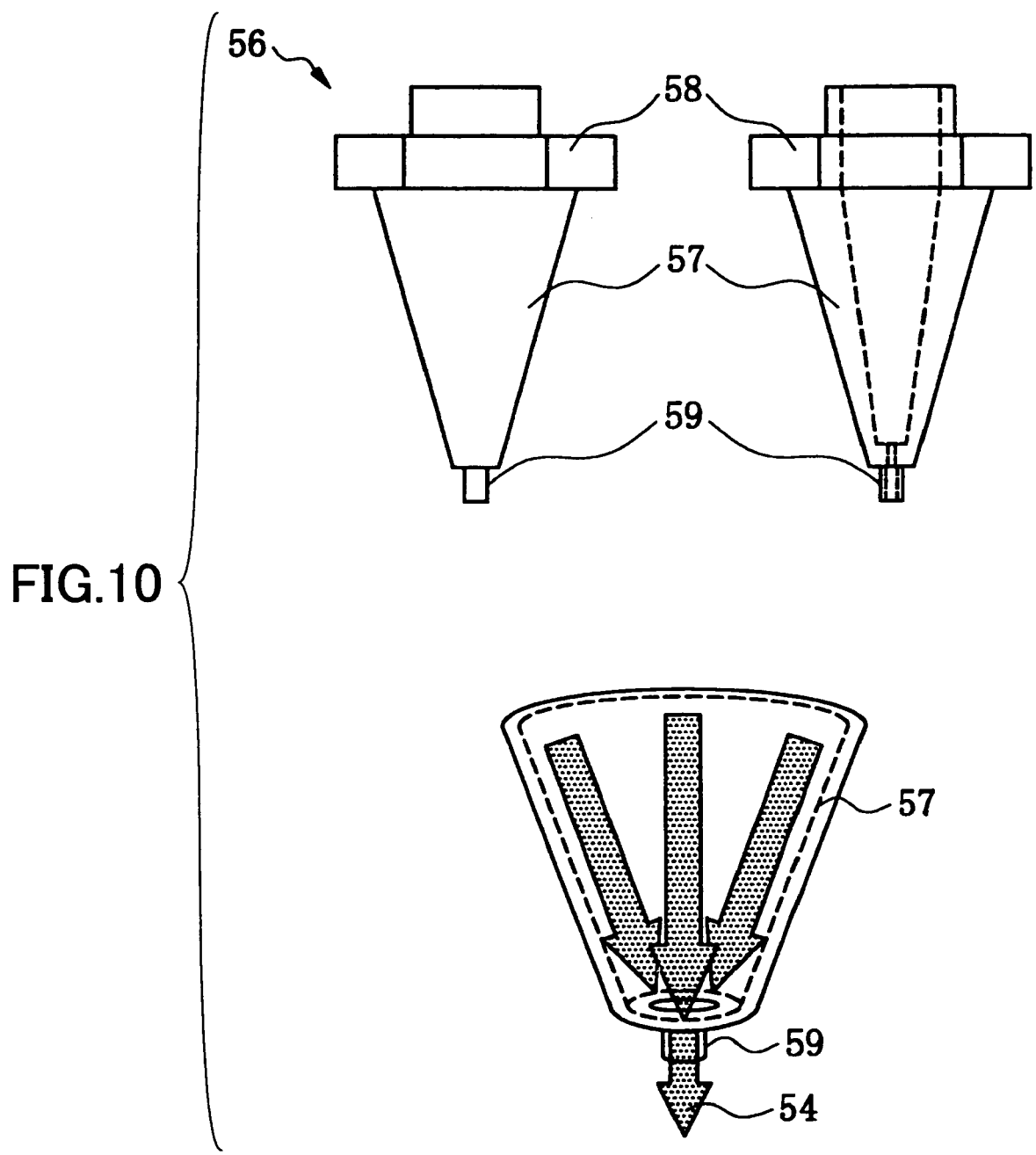
FIG. 10 is a diagram showing an internal structure of a nozzle main body of an adhesive nozzle according to an embodiment of the present invention.

FIG. 10 is an enlarged diagram showing an exemplary configuration of an adhesive nozzle that may be used in the adhesive applying apparatus shown in FIG. 9.

The adhesive applying nozzle 56 of FIG. 10 includes a nozzle main body 57, an engaging portion 58, and a nozzle tip portion 59. It is noted that the broken lines shown in FIG. 10 indicate the portion through which the adhesive may be inserted. Also, the arrows shown in this drawing indicate the direction of air pressure that is applied from the upper side. As is shown in this drawing, by applying pressure from the upper wider side of a conical structure toward the lower center outlet, adhesive may be discharged from the discharge outlet of the adhesive applying nozzle (see arrow 54), in which case adhesive may be prevented from being left behind at the corners of the nozzle 56.

Figure 1A:
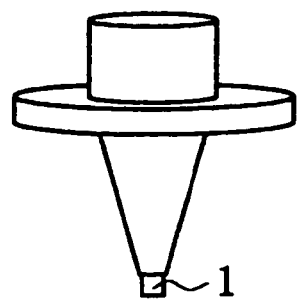
FIGS. 1A~1D are diagrams showing a configuration of an adhesive nozzle according to an embodiment of the present invention.

FIGS. 1A~1D are diagrams illustrating a structure of a nozzle tip portion of an adhesive nozzle according to an embodiment of the present invention. FIG. 1A is a diagram showing an overall structure of the adhesive nozzle of the present embodiment including a nozzle tip portion 1. It may be perceived from this drawing that the nozzle tip portion 1 makes up a small portion of the entire adhesive nozzle.

Figure 1B:
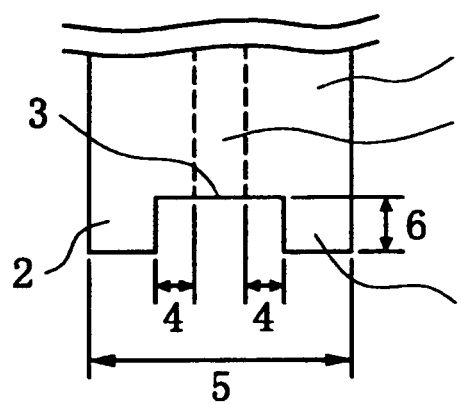
Figure 1D:
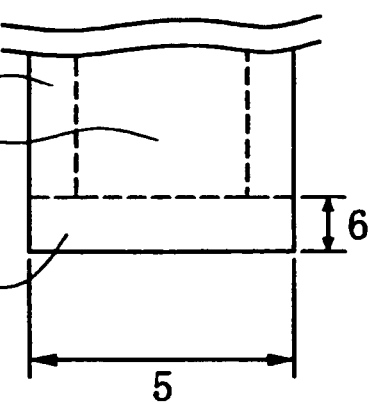
Figure 1C:
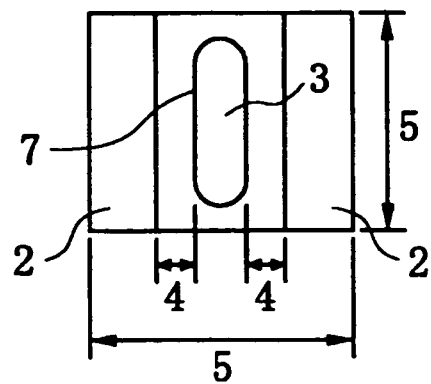

FIG. 1B is a front view; FIG. 1C is a plan view; and FIG. 1D is a side view of the nozzle tip portion 1 shown in FIG. 1A. As can be appreciated from FIG. 1B, according to the present embodiment, an outlet of an adhesive discharge portion 7 indicated by broken lines is provided at the center portion of the nozzle tip portion 1. At an outer periphery of the nozzle tip portion, a protruding portion 2 is provided. In other words, the periphery of the nozzle tip portion forms a protrusion with height 6, and the center of the nozzle tip portion forms a recessed portion. As is shown in FIGS. 1B and 1C, a gap 4 is provided between the peripheral protruding portion 2 and the outlet of the adhesive discharge portion 7. It is noted that a space surrounded by the protruding portion 7 is formed by the gap 4.

It is noted that the diameter 5 of the nozzle tip portion is arranged to be greater than that of a conventional nozzle. Specifically, the diameter of a conventional nozzle is usually arranged to be within a range of 0.5~0.8 mm; however, in the present embodiment, the diameter of the nozzle is arranged to be 1.0 mm.

As can be appreciated from FIG. 1C, the tip 3 of the adhesive discharge portion 7 is arranged into an oval shape.

Figure 2:
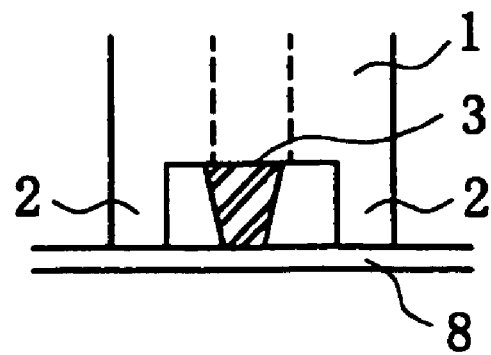
FIG. 2 is a front view of a nozzle tip portion of the adhesive nozzle of the present embodiment being placed on a printed circuit board.

FIG. 2 is a plan view of the nozzle tip portion 1 of FIG. 1 being held in contact with a printed circuit board 8. It is noted that components shown in this drawing that are identical to those shown in FIGS. 1A~1D are given the same references.

FIG. 2 illustrates a state in which adhesive is discharged from the tip 3 of an adhesive discharge portion 7.

As is shown in this drawing, the adhesive that is discharged within a space formed by the printed circuit board 8 and the protruding portion 2 comes into contact with the printed circuit board 8.

When adhesive is discharged from the adhesive discharge portion 7 in this manner, the adhesive may be prevented from coming into contact with the protruding portion 2.

Figure 3:
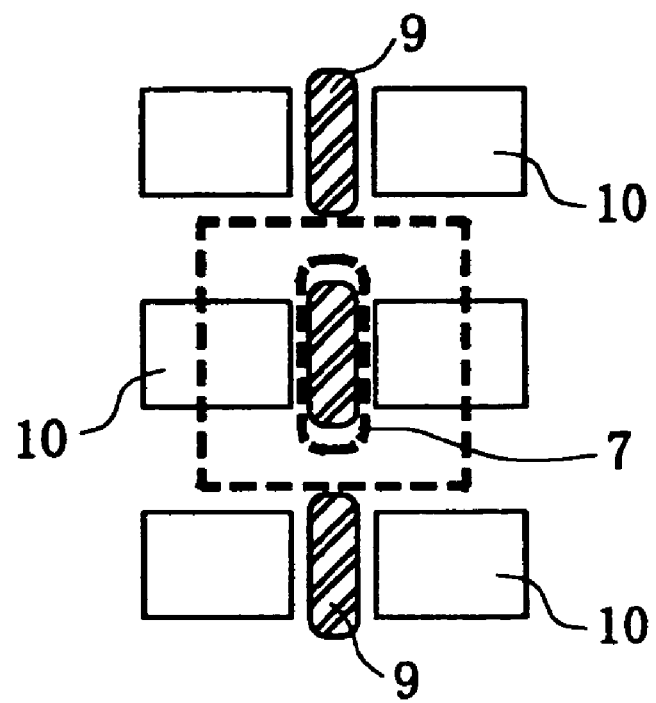
FIG. 3 is a diagram showing the positioning of the nozzle tip portion and adhesive applied by the adhesive nozzle.

FIG. 3 is a plan view illustrating the positioning of adhesive successively applied between pads provided on a printed circuit board. Specifically, FIG. 3 shows a portion of an arrangement of plural pads 10 that are placed on a printed circuit board. In the present example, adhesive is successively applied in between adjacent pads starting from the top. It is noted that the broken lines in FIG. 3 indicate the current location of the adhesive nozzle. As can be appreciated from this drawing, according to the present embodiment, adhesive 9 is prevented from coming into contact with the pads 10.

FIGS. 4A~4D are diagrams illustrating process steps of an adhesive applying operation according to an embodiment of the present invention.

Figure 4A:
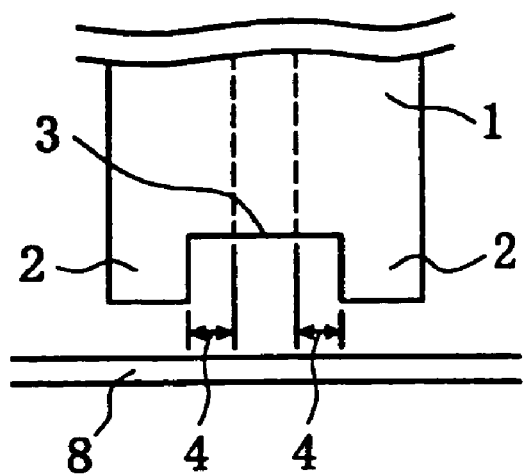
FIGS. 4A~4D are diagrams illustrating process steps for realizing adhesive application using the adhesive nozzle according to the present embodiment.
Figure 4B:
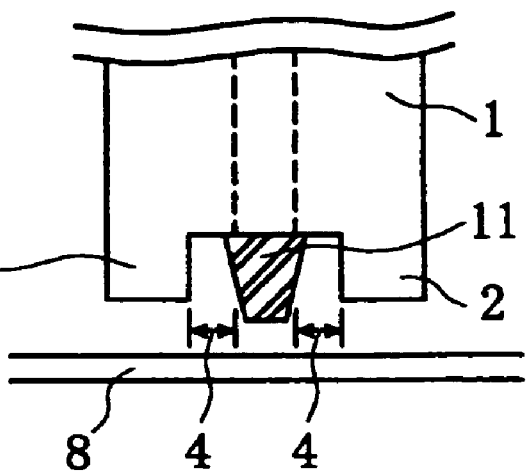

FIG. 4A illustrates a state in which the nozzle tip portion 1 is placed above the printed circuit board 8. In the process step illustrated by FIG. 4B, a suitable amount of adhesive 11 is discharged from the adhesive discharge portion tip 3 of the nozzle tip portion 1. In this case, since the gap 4 is provided between the adhesive discharge portion tip 3 and the protruding portion 2 of the nozzle tip portion 1, the adhesive may be prevented from coming into contact with the protruding portion 2.

Figure 4C:
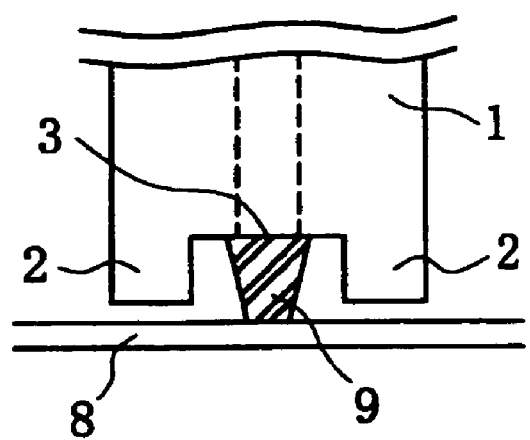
Figure 4D:
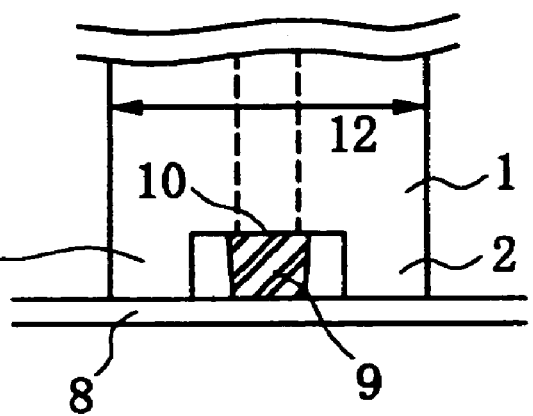

In the process step illustrated by FIG. 4C, the tip of the protruding portion 2 of the nozzle tip portion 1 and the discharged adhesive 11 are arranged to come into contact with the printed circuit board 8, and the discharged adhesive 11 comes into contact with the printed circuit board 8 as applied adhesive 9, which is then pressed to spread out as is illustrated in FIG. 4D.

In this case, since the protruding portion 2 is provided, the adhesive discharge portion tip 3 is prevented from coming into contact with the printed circuit board 8. Accordingly, the spreading of the applied adhesive 9 on the printed circuit board 8 may be controlled.

As is shown in FIG. 4D, since the protruding portion 2 is arranged to be greater in dimension compared to the adhesive discharge portion tip 3, the discharged adhesive 11 and the applied adhesive 9 are prevented from spreading to a dimension greater than the outer dimension 12 of the protruding portion 2.

Also, the spreading of the applied adhesive 9 may be controlled by adjusting the height of the protruding portion 2 according to the amount of adhesive discharged from the adhesive discharge portion tip 3.

It is noted that the outer dimension of the surface of the nozzle tip portion 1 is preferably set to 1.5×1.5 mm or smaller. Also, it is noted that the nozzle tip portion 1 may possibly be designed to have a minimum dimension of 0.3×0.3 mm.

In this way, even when the spacing between chip components is arranged to be narrow, the chip components may be prevented from coming into contact with the applied adhesive, and the adhesive may be prevented from coming into contact with the nozzle tip portion 1.

It is noted that the dimension of the opening (outlet) of the adhesive discharge portion tip 3 is preferably arranged to be no more than 0.9×0.3 mm, and may possibly be designed to have a minimum dimension of 0.15×0.12 mm.

Also, it is noted that particles such as hardener particles included in the adhesive have diameters of around 0.06 mm. Thus, in order to prevent clogging of the adhesive within the nozzle, the nozzle opening has to have a dimension of at least two times the diameter of the particles included in the adhesive. In the present embodiment, the adhesive nozzle is arranged to apply the adhesive to form a long oval shaped applied adhesive portion on the printed circuit board 8. Thereby, the lengthwise dimension of the nozzle opening of the adhesive discharge portion tip may be arranged to be greater than 0.12 mm, for example.

Further, it is noted that the height of the protruding portion 2 is preferably arranged to be no more than 0.15 mm, and may possibly be arranged to have a minimum height of 0.01 mm.

In the present example, the height of the protruding portion 2 of the nozzle is arranged to be 0.05 mm; however the height of the protruding portion 2 may easily be arranged to be around 0.03 mm.

Also, a reinforcing process is preferably conducted on the nozzle tip portion 1.

It is noted that the adhesive nozzle according to the present example having the dimensions indicated above is adapted for 1005 size (1.0×0.5 mm) chip components; however, the nozzle with the same configuration may be used for 1608 size (1.6×0.8 mm) chip components as well. As a general rule, the outer dimensions of the nozzle tip portion, the diameter of the adhesive discharge outlet, and the height of the protruding portion may be arranged to be larger than the values indicated above in a case where the chip components being used are greater than 1005 size chip components, and the values may be made smaller for chip components that are smaller than 1005 size chip components. However, it is noted that there is a limit to miniaturizing the nozzle in order to ensure design accuracy. Also, the dimensions of the adhesive nozzle need to be arranged so as to prevent clogging of particles included in the adhesive.

It is noted that the adhesive nozzle with the dimensions described may also be used for chip components that are greater than 1608 size chip components by arranging the nozzle to conduct the adhesive application process plural times on one spot, for example.

FIGS. 5A~5F are diagrams illustrating the difference between the nozzle according to the prior art and the nozzle according to an embodiment of the present invention.

Figure 5A:
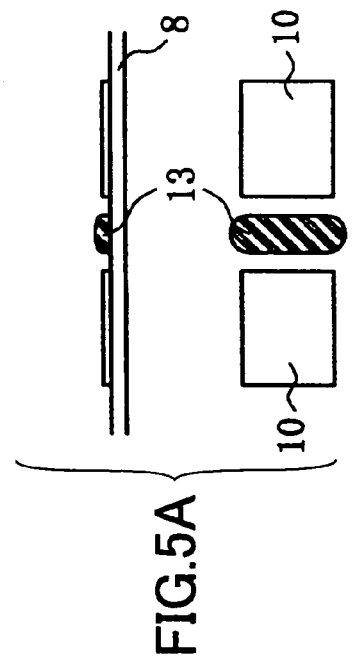
FIGS. 5A~5F are diagrams illustrating the difference between an adhesive nozzle according to the prior art and the adhesive nozzle according to the present embodiment.
Figure 5B:
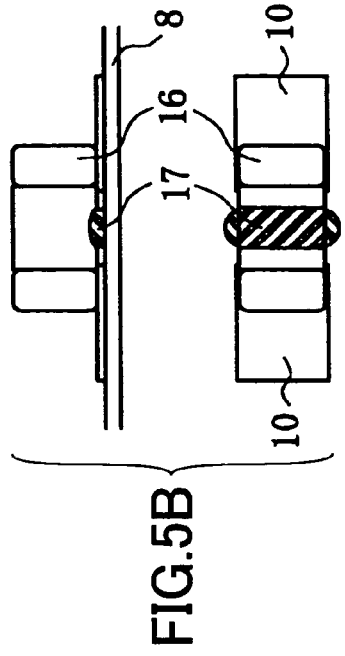
Figure 5C:
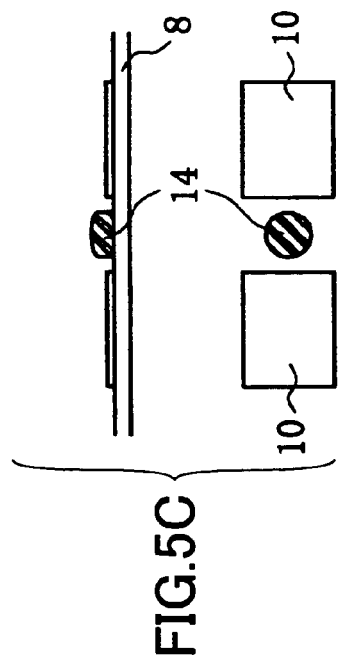
Figure 5D:
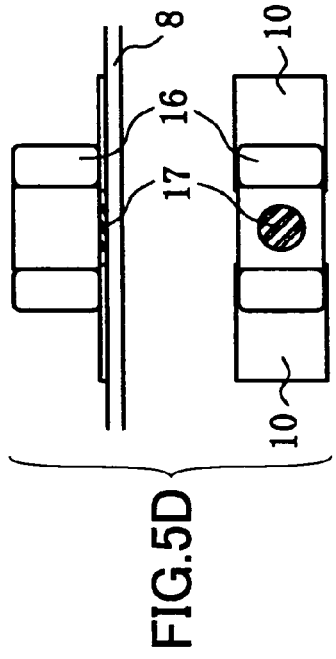
Figure 5E:
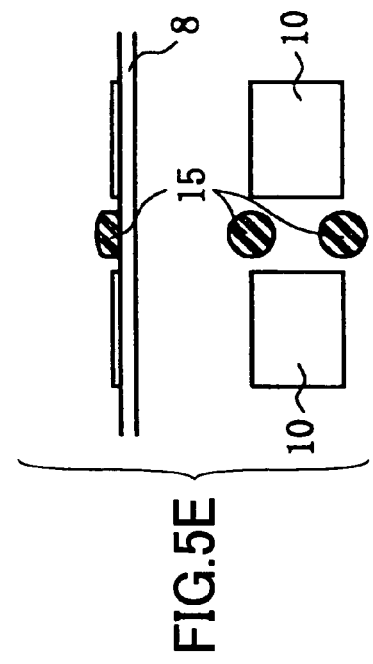
Figure 5F:
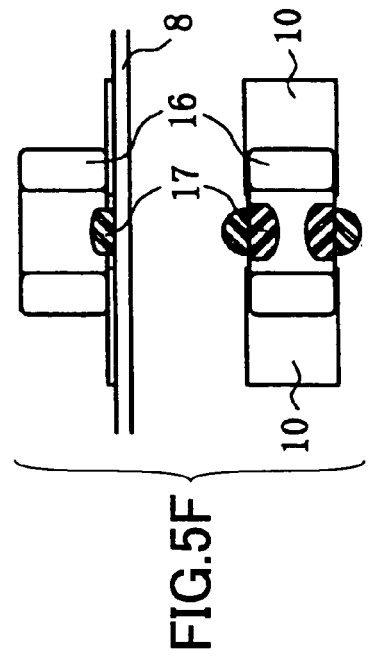

FIGS. 5A and 5B illustrate the shape of the applied adhesive according to an embodiment of the present invention; FIGS. 5C and 5D illustrate the shape of the applied adhesive according to the prior art; and FIGS. 5E and 5F illustrate the shape of applied adhesive in the case of realizing two point bonding according to the prior art. It is noted that each of FIGS. 5A~5F show shapes of the applied adhesive in front view and in plan view, respectively.

The difference between the nozzle according to the present embodiment and the nozzle according to the prior art lies in the shapes of their respective nozzle tip portions.

Referring to FIG. 5A, in the case of applying adhesive by positioning the adhesive nozzle tip portion between two pads 10 provided on the printed circuit board 8, the applied adhesive is arranged to have a shape that is substantially identical to the shape of the adhesive discharge portion tip 3 of the nozzle tip portion 1 (i.e., long oval shape), as is represented by adhesive shape 13.

FIG. 5B is a diagram showing the state of the applied adhesive in a case where a chip component 16 is placed over the two pads 10 provided on the printed circuit board 8 and the applied adhesive provided between the two pads 10 shown in FIG. 5A. In this case, the applied adhesive is slightly pressed by the chip component 16 to slightly expand as a result but substantially retains its long oval shape.

Referring to FIGS. 5C and 5E, in the prior art, in a case where adhesive is applied by positioning the adhesive nozzle tip portion between two pads 10 provided on a printed circuit board 8, one or two circular shaped applied adhesive portions 14 are formed. Referring to FIGS. 5D and 5F, when a chip component 16 is placed over the two pads after the adhesive is applied between the two pads, the applied adhesive is slightly pressured by the chip component 16 to slightly expand as a result but basically maintains its circular shape.

As can be appreciated from the lower plan view of FIG. 5F, when two point bonding is conducted, a relatively large portion of the applied adhesive spreads out to the sides of the chip component 16 so that a strong bond may be realized. In the present embodiment, bonding of the chip component 16 is conducted through one point bonding. However, since the applied adhesive is arranged into a long oval shape, a large portion of the applied adhesive may spread out to the sides of the chip component 16 so that a strong bond may be realized even with one point bonding.

FIGS. 6A~6F are front views and plan views illustrating states of the adhesive applying nozzle according to the prior art and/or the applied adhesive before discharging the adhesive, after discharging the adhesive onto the printed circuit board 8 but before placing the adhesive in contact with the printed circuit board 8, and after placing the adhesive on the printed circuit board 8, respectively.

FIGS. 7A~7F are front views and plan views illustrating states of the adhesive applying nozzle according to the present embodiment and/or the applied adhesive before discharging the adhesive, after discharging the adhesive onto the printed circuit board 8 but before placing the adhesive in contact with the printed circuit board 8, and after placing the adhesive on the printed circuit board 8, respectively.

In the following comparisons are made between the prior art and the present embodiment with reference to the above drawings. First, referring to FIGS. 6A, 6B, 7A, and 7B, the diameter of the nozzle according to the prior art is arranged to be within a range of 0.5~0.8 mm, whereas the diameter of the nozzle according to the present embodiment is arranged to be 1.0 mm. Accordingly, in the present embodiment, the proportion of the adhesive accommodating portion (adhesive discharge portion) with respect to the nozzle diameter may be arranged to be smaller compared to the prior art as is indicated by the broken lines in the drawings. Also, as can be appreciated from the plan views, the adhesive discharge outlet of the adhesive nozzle according to the prior art is arranged into a circular shape whereas the adhesive outlet of the adhesive nozzle according to the present embodiment is arranged into a long oval shape.

Next, referring to FIGS. 6C, 6D, 7C, and 7D, when adhesive is discharged from the nozzle tip portion, in the prior art, the discharged adhesive 11' comes into contact with a printed circuit board contacting surface 18' of the nozzle tip portion. In contrast, in the present embodiment, the discharged adhesive 11 does not come into contact with the printed circuit board contacting surface 18' of the nozzle tip portion. Accordingly, in the present embodiment, the discharged adhesive does not come into contact with undesired portions so that soiling of the nozzle may be reduced and a cleaning process may be omitted.

Also, referring to FIGS. 6E, 6F, 7E, and 7F, in the prior art, since the discharged adhesive comes into contact with the printed circuit board contacting surface 18' of the nozzle tip portion, the applied adhesive 9 spreads across the printed circuit board 8 to be arranged into a circular shape 19 having a diameter that is significantly greater than the diameter of the discharged adhesive 11'. In contrast, according to the present embodiment, the shape of the discharged adhesive 11 does not change significantly upon being applied to the printed circuit board 8, and retains a long oval shape that is substantially identical to the outlet configuration of the adhesive discharge portion tip 3.

In the following, advantages and disadvantages of the prior art nozzle and the nozzle of the present embodiment are described.

In the prior art, a protruding portion 2' and an adhesive flow path portion 7' are formed into a uniform structure so that the discharged adhesive may come into contact with the printed circuit board contacting surface 18' of the nozzle tip portion. In the case where the discharged adhesive 11' comes into contact with the printed circuit board contacting surface 18', the adhesive may spread due to the pressure applied by the nozzle tip portion to have a dimension (shape 19) that is greater than the outer dimension of the nozzle tip portion upon being applied to the printed circuit board 8.

On the other hand, according to the present embodiment, the protruding portion 2 of the nozzle tip portion is independently formed with respect to the adhesive flow path portion (adhesive discharge portion) 7 so that the discharged adhesive may be prevented from flowing along the protruding portion 2 to come into contact with the printed circuit board contacting surface 18' of the nozzle tip portion.

In this way, when the discharged adhesive 11 is applied to the printed circuit board 8, the discharged adhesive 11 may be prevented from spreading due to the pressure from the nozzle tip portion so that stable application of adhesive at a small dimension may be realized.

Figure 8A:
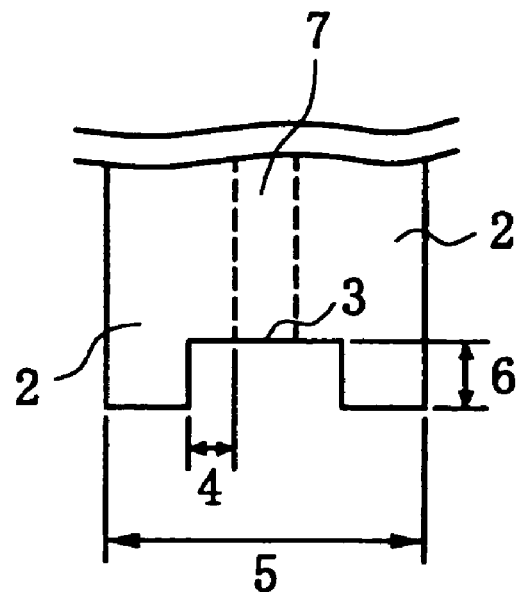
FIGS. 8A and 8B are diagrams showing a configuration of a nozzle tip portion of an adhesive nozzle according to another embodiment of the present invention.
Figure 8B:
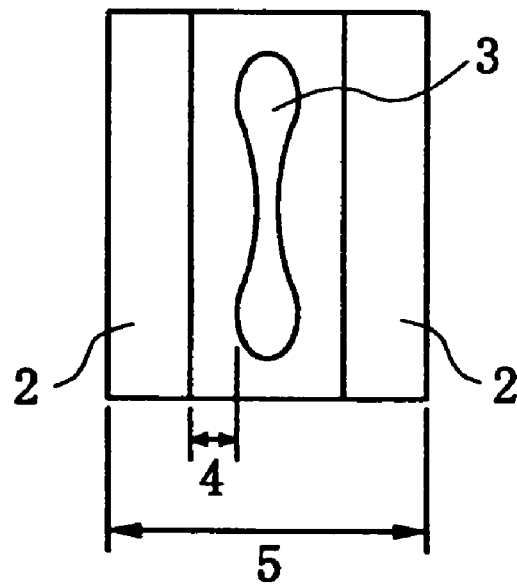

FIGS. 8A and 8B are diagrams illustrating a structure of a nozzle tip portion according to another embodiment of the present invention. It is noted that FIG. 8A is a front view and FIG. 8B is a top view of the nozzle tip portion according to the present embodiment. As can be appreciated from the plan view of FIG. 8B, the present embodiment differs from the embodiment of FIGS. 7A and 7B in that the nozzle outlet at the adhesive discharge portion tip 3 is arranged to be a pear-shaped rather than oval-shaped. It is noted that in the case of using the nozzle of FIGS. 7A and 7B, although the adhesive discharge portion tip 3 is shaped into a long oval, the adhesive applied therefrom tends to widen at the middle portion. Thus, with the nozzle according to the embodiment of FIGS. 8A and 8B, since the adhesive discharge portion tip 3 is pear-shaped with a narrow portion at the middle, the applied adhesive may widen at the middle to be arranged into a long oval shape. It is noted that in the present embodiment, the adhesive flow path portion 7 penetrating through the nozzle as is indicated by the broken lines in FIG. 8A is also arranged to have a pear-shaped cross-section.

In another embodiment, the adhesive flow path portion 7 forming the adhesive discharge portion within the nozzle main body may be arranged to have an oval cross-section while the adhesive discharge portion at the nozzle tip portion may be arranged to have a pear-shaped cross-section.

Figure 11A:
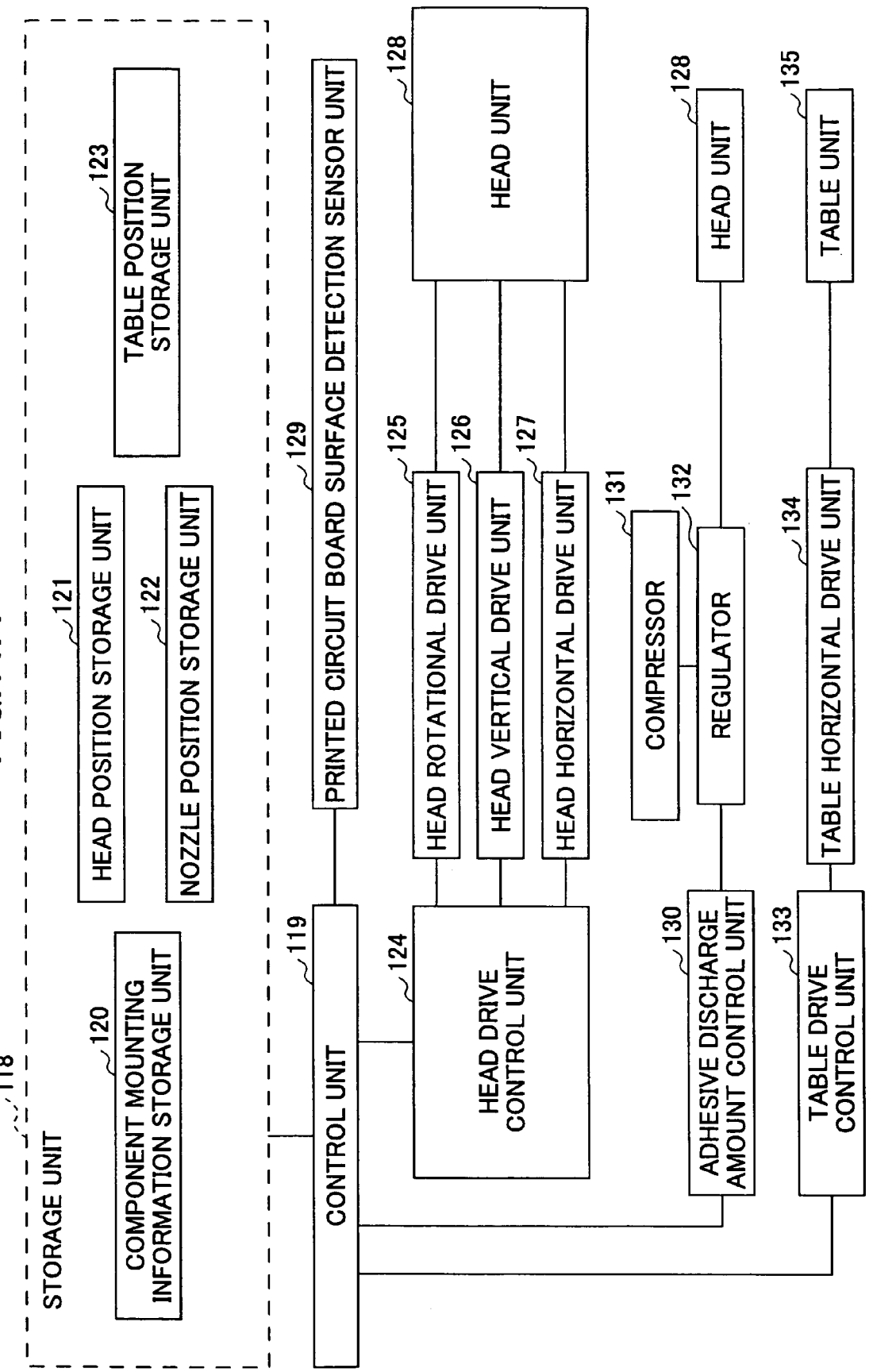
FIG. 11A is a block diagram showing a configuration of a drive control mechanism of the adhesive applying apparatus according to the present embodiment.

FIG. 11A is a block diagram showing a configuration of a drive control mechanism of an adhesive applying apparatus according to an embodiment of the present invention; and FIG. 11B is a table representing storage contents of a component mounting information storage unit.

The drive control mechanism of FIG. 11A includes a storage unit 118 that is made up of a component mounting information storage unit 120, a head position storage unit 121, a nozzle position storage unit 122, and a table position storage unit 123. As is shown in FIG. 11B, the component mounting information storage unit 120 stores information pertaining to the mounting position (e.g., head position, table position) such as X=a, Y=a'; X=b, Y=b'..., and the mounting direction (e.g., nozzle direction) such as A, B, ..., and the component shape for each of the component names (chip components) being mounted and registered.

The head position storage unit 121 stores the current mounting position (e.g., head position: X=a); the table position storage unit 123 stores the current table position (e.g., table position: Y=a'); and the nozzle position storage unit 122 stores the current nozzle position (e.g., nozzle position: A).

The drive control mechanism also includes a control unit 119 that is realized by a head drive control unit 124, an adhesive discharge amount control unit 130, a table drive control unit 133, and a printed circuit board surface detection sensor unit 129 for detecting the distance from the nozzle tip portion to the surface of the printed circuit board 8. The head drive control unit 124 includes a head rotational drive unit 125 that rotates the nozzle in accordance with a mounting direction, a vertical drive unit 126 that moves the adhesive applying head in up-down directions (Z directions), and a horizontal drive unit 127 that moves the adhesive applying head 45 in horizontal directions (X directions). The adhesive discharge amount control unit 130 includes a regulator 132 that controls the air pressure being supplied to the nozzle from a compressor 131. The table drive control unit 133 includes a table horizontal drive unit 134 that moves a table unit 135 in horizontal directions (Y directions).

Figure 12:
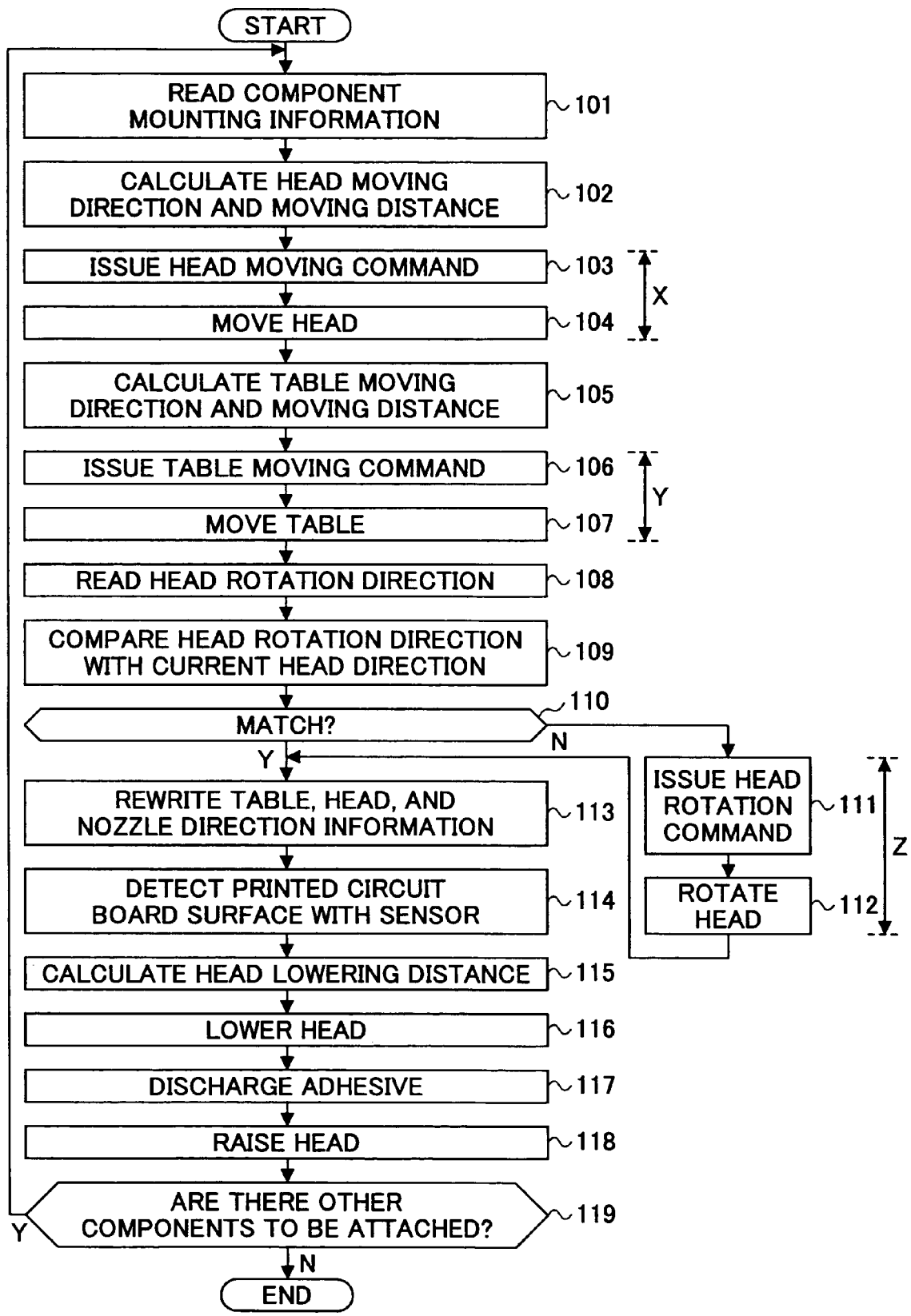
FIG. 12 is a flowchart illustrating operations of the adhesive applying apparatus according to the present embodiment.

FIG. 12 is a flowchart illustrating operations of an adhesive applying apparatus according to an embodiment of the present invention.

According to FIG. 12, first, in step 101, information stored in the component mounting information storage unit 120 is read to determine an adhesive applying position. For example, the mounting position information X=b, Y=b' stored in the component mounting information storage unit 120 is compared with the current mounting position X=a stored in the head position storage unit 121 and the current mounting position Y=a' stored in the table position storage unit 123 to calculate the next chip component mounting position. Then, in step 102, the moving direction and moving distance for the head are calculated, and in step 103, a head moving command is issued. Then, in step 104, the head is moved in the X direction according to the head moving command.

In step 105, the moving direction and moving distance for the table are calculated, and in step 106, a table moving command is issued. Then, in step 107, the table is moved in the Y direction according to the table moving command.

In step 108, the mounting direction information is read from the component mounting information storage unit 120, and in step 109, the read information is compared with the current mounting direction information stored in the nozzle position storage unit 122 to determine the adhesive applying direction. For example, the mounting direction information B is read from the component mounting information storage unit 120 and the read information is compared with the current mounting direction information A stored in the nozzle position storage unit 122. Then, in step 110, it is determined whether the mounting direction information of the component mounting information storage unit 120 and the nozzle position storage unit 122 correspond (match). If the information of the component mounting information storage unit 120 and the nozzle position storage unit 122 correspond, the position of the head is left unchanged. If the information of the component mounting information storage unit 120 and the nozzle position storage unit 122 are different, a head rotating command is issued in step 111, and the nozzle is moved in the Z direction according to the nozzle rotating command in step 112.

Then, in step 113, information pertaining to the current head position, table position and nozzle position (nozzle direction) are updated. Then, the calculated data pertaining to the mounting position and mounting direction are conveyed to the control unit 119 to be distributed to the head drive control unit 124 and the table drive control unit 133. In turn, the head unit 28 and the table unit 35 are moved by a drive motor (not shown) to place the adhesive applying head 45 to the next mounting position.

Then, in step 114, the distance to the printed circuit board surface is calculated by the printed circuit board surface detection sensor unit 129 provided in the adhesive applying apparatus. In step 115, the control unit 119 calculates the lowering distance for lowering the adhesive applying head, and in step 116, the control unit 119 informs the head vertical drive unit 126 of the lowering distance. In turn, the head vertical drive unit 126 lowers the adhesive applying head according to the lowering distance from the control unit 119 to place the adhesive nozzle on the surface of the printed circuit board and discharge a suitable amount of adhesive on the printed circuit board (step 117). Once the application of a suitable amount of adhesive is completed, the adhesive applying head is raised (step 118), and a determination is made as to whether there are other components to be attached to the printed circuit board (step 119).

In the following, advantageous effects that may be achieved by embodiments of the present invention are described.

According to an embodiment, a gap is provided between the adhesive discharge opening portion of the nozzle tip portion and the printed circuit board so that the adhesive discharged from the adhesive discharge opening portion may be prevented from spreading over a wide range upon being applied to the printed circuit board.

According to another embodiment, a nozzle tip that comes into contact with the printed circuit board an adjacent component, an adjacent pad, and/or adhesive applied to an adjacent area upon conducting adhesive application.

According to another embodiment, the applied adhesive is arranged into a long and narrow shape so as to prevent deviation of the components and strengthen the bond of the components.

According to another embodiment, by arranging the height of the protruding portion to be less than or equal to 0.15 mm, precise and stable application of adhesive may be realized.

According to another embodiment, by conducting wire fabrication, micro fabrication may be facilitated.

According to an embodiment, by conducting a reinforcing process, the durability of the nozzle tip portion may be enhanced. In turn, damages such as friction and deformation of the nozzle tip may be reduced, and the protruding portion of the nozzle tip portion may be protected.

According to another aspect, a printed circuit board may be fabricated at a low cost by using the nozzle according to embodiments of the present invention.

Further, the present invention is not limited to the specific embodiments described above, and variations and modifications may be made without departing from the scope of the present invention.

The present application is based on and claims the benefit of the earlier filing date of Japanese Patent Application No. 2004-154468 filed on May 25, 2004, and Japanese Patent Application No. 2005-028453 filed on Feb. 4, 2005, the entire contents of which are hereby incorporated by reference.

What is claimed is:

1. A micro adhesive nozzle for applying adhesive on a printed circuit board, the nozzle comprising:
 a nozzle main body configured to supply adhesive to a nozzle tip portion located at an end of the main body; and
 the nozzle tip portion including
  an adhesive discharge opening formed within the periphery of the nozzle tip portion, said discharge opening comprising a width and a length, and
  a plurality of rectangular protrusions arranged at a periphery of the nozzle tip portion, each of said protrusions being separated from the adhesive discharge opening by a gap, wherein each of the protrusions are configured to extend the entire length of the adhesive discharge opening to form a trench, and a distance of the gap is greater than the width of the adhesive discharge opening.

2. The micro adhesive nozzle as claimed in claim 1, wherein
the nozzle tip portion is arranged to have an outer dimension that is less than or equal to 1.5×1.5 mm.

3. The micro adhesive nozzle as claimed in claim 1, wherein
the adhesive discharge opening portion is arranged to have a dimension that is less than or equal to 0.9×0.3 mm.

4. The micro adhesive nozzle as claimed in claim 1, wherein
the protrusions are arranged to have a height that is less than or equal to 0.15 mm.

5. The micro adhesive nozzle as claimed in claim 1, wherein
the adhesive discharge opening portion is arranged into a long oval-shaped hole, and the adhesive applied on the printed circuit board is arranged into a long oval shape.

6. The micro adhesive nozzle as claimed in claim 1, wherein
the adhesive discharge opening portion is arranged into a long pear-shaped hole, and the adhesive applied on the printed circuit board is arranged in to a pear shape.

7. The micro adhesive nozzle as claimed in claim 6, wherein
the nozzle main body includes an adhesive discharge path portion that is arranged into a long oval-shaped hole that is connected to the pear-shaped adhesive discharge opening portion.

8. The micro adhesive nozzle as claimed in claim 1, wherein
the protrusions are arranged to protrude from an edge of the nozzle tip portion such that the protrusions are perceived as a protrusion in front view and in rear view, and is perceived as an extending wall in side view.

9. An adhesive applying apparatus, comprising:
a micro adhesive nozzle for applying adhesive on a printed circuit board, the nozzle including
an adhesive discharge opening formed within the periphery of the nozzle tip portion, said discharge opening comprising a width and a length, and
a plurality of rectangular protrusions arranged at a periphery of the nozzle tip portion, each of said protrusions being separated from the adhesive discharge opening by a gap,
wherein the protrusions are configured to extend the entire length of the adhesive discharge opening to form a trench, and a distance of the gap is greater than the width of the adhesive discharge opening.

* * * * *